(12) United States Patent
Sambonsugi

(10) Patent No.: US 11,146,756 B2
(45) Date of Patent: Oct. 12, 2021

(54) IMAGE APPARATUS WITH LOCKING OPERATION FOR SERIAL DATA

(71) Applicant: CANON KABUSHIKI KAISHA, Tokyo (JP)

(72) Inventor: Hideaki Sambonsugi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/579,467

(22) Filed: Sep. 23, 2019

(65) Prior Publication Data

US 2020/0106986 A1 Apr. 2, 2020

(30) Foreign Application Priority Data

Sep. 28, 2018 (JP) .............................. JP2018-184793

(51) Int. Cl.
| | | |
|---|---|---|
| H04N 5/932 | (2006.01) |
| H03L 7/095 | (2006.01) |
| H04N 5/956 | (2006.01) |
| H03L 7/12 | (2006.01) |
| H03L 7/08 | (2006.01) |
| H03L 7/087 | (2006.01) |
| H04N 5/77 | (2006.01) |

(52) U.S. Cl.
CPC ............ *H04N 5/932* (2013.01); *H03L 7/095* (2013.01); *H03L 7/12* (2013.01); *H04N 5/956* (2013.01)

(58) Field of Classification Search
USPC .................................. 386/200–234, 239–248
See application file for complete search history.

(56) References Cited

U.S. PATENT DOCUMENTS

| | | | | |
|---|---|---|---|---|
| 2006/0209735 | A1* | 9/2006 | Evoy ...................... | H04L 7/041 370/315 |
| 2009/0085622 | A1* | 4/2009 | Shen ........................ | H03L 7/10 327/159 |
| 2009/0213212 | A1* | 8/2009 | Nakamura ......... | A61B 1/00006 348/65 |
| 2011/0128590 | A1* | 6/2011 | Kitai .................. | H04N 1/00933 358/474 |
| 2011/0286562 | A1* | 11/2011 | Jeon ...................... | H03L 7/0807 375/371 |
| 2014/0204225 | A1* | 7/2014 | Takimoto ........... | H04N 1/00464 348/207.1 |
| 2017/0116954 | A1* | 4/2017 | Baek .................... | G09G 3/2096 |

(Continued)

FOREIGN PATENT DOCUMENTS

| | | |
|---|---|---|
| CN | 1836414 A | 9/2006 |
| CN | 101854490 A | 10/2010 |

(Continued)

*Primary Examiner* — Hung Q Dang
(74) *Attorney, Agent, or Firm* — Canon U.S.A., Inc. IP Division

(57) ABSTRACT

An imaging apparatus allows a clock data recovery device to reestablish reception of data even when the clock data recovery device has failed to lock a phase. A reception unit includes a locking unit configured to perform a locking operation for receiving the data and a detection unit configured to detect a lock state of the locking unit. A control unit controls performing of the locking operation again by the locking unit in a case where a lock is not achieved, based on a detection result detected by the detection unit.

22 Claims, 11 Drawing Sheets

(56) References Cited

U.S. PATENT DOCUMENTS

2019/0147831 A1* 5/2019 Lee .................... G09G 3/20
                                                345/691
2020/0021295 A1* 1/2020 Remple ................ H03L 7/0802

FOREIGN PATENT DOCUMENTS

| CN | 103001628 A | 3/2013 |
| CN | 103139486 A | 6/2013 |
| CN | 105246394 A | 1/2016 |
| CN | 107454350 A | 12/2017 |
| JP | 2018-74312 A | 5/2018 |

* cited by examiner

FIG.6A

THE IMAGE HAS BEEN
UNABLE TO BE CAPTURED
BECAUSE AN ERROR
HAS OCCURRED.
PLEASE TRY TO CAPTURE
THE IMAGE AGAIN.

FIG.6B

PLEASE RESTART
THE CAMERA AFTER
POWERING OFF
THE CAMERA AND
MOUNTING A BATTERY
AGAIN.

IMAGE APPARATUS WITH LOCKING OPERATION FOR SERIAL DATA

BACKGROUND

Field

One disclosed aspect of the embodiments relates to an imaging apparatus, and, in particular, to an imaging apparatus including an image sensor.

Description of the Related Art

Imaging apparatuses including an image sensor such as a complementary metal-oxide semiconductor (CMOS) sensor use a small-amplitude differential signal such as a signal represented by low voltage differential signaling (LVDS) as a method for outputting image data (an output signal) from the image sensor to an external signal processing chip. This is a signal transmission method that transmits a clock for use in the communication and the data itself separately from each other. Further, in recent years, according to an increase in an output signal amount due to, for example, an increase in the number of pixels in the image sensor, a signal transmission technique may have been employed with use of the small-amplitude differential signal with the aim of speeding up an output rate of the output signal.

For example, Japanese Patent Application Laid-Open No. 2018-74312 discloses a configuration of a clock data recovery device in an imaging apparatus including an image sensor that transfers an output signal.

SUMMARY

According to an aspect of the embodiments, an imaging apparatus includes an image sensor, a reception unit, a control unit, and an image processing unit. The image sensor includes a transmission unit configured to transmit serial data based on a clock embedded procedure. The serial data has image data. The reception unit is configured to receive the serial data. The control unit is configured to control the reception unit. The image processing unit is configured to be used on the image data included in the serial data received by the reception unit. The reception unit includes a locking unit configured to perform a locking operation for receiving the data and a detection unit configured to detect a lock state of the locking unit. The control unit controls performing of the locking operation again by the locking unit in a case where locking is not achieved, based on a detection result detected by the detection unit.

Further features of the disclosure will become apparent from the following description of exemplary embodiments (with reference to the attached drawings).

BRIEF DESCRIPTION OF THE DRAWINGS

FIGS. 6A and 6B are diagrams each illustrating the operation of the imaging apparatus according to the first exemplary embodiment.

DESCRIPTION OF THE EMBODIMENTS

Figure 1:
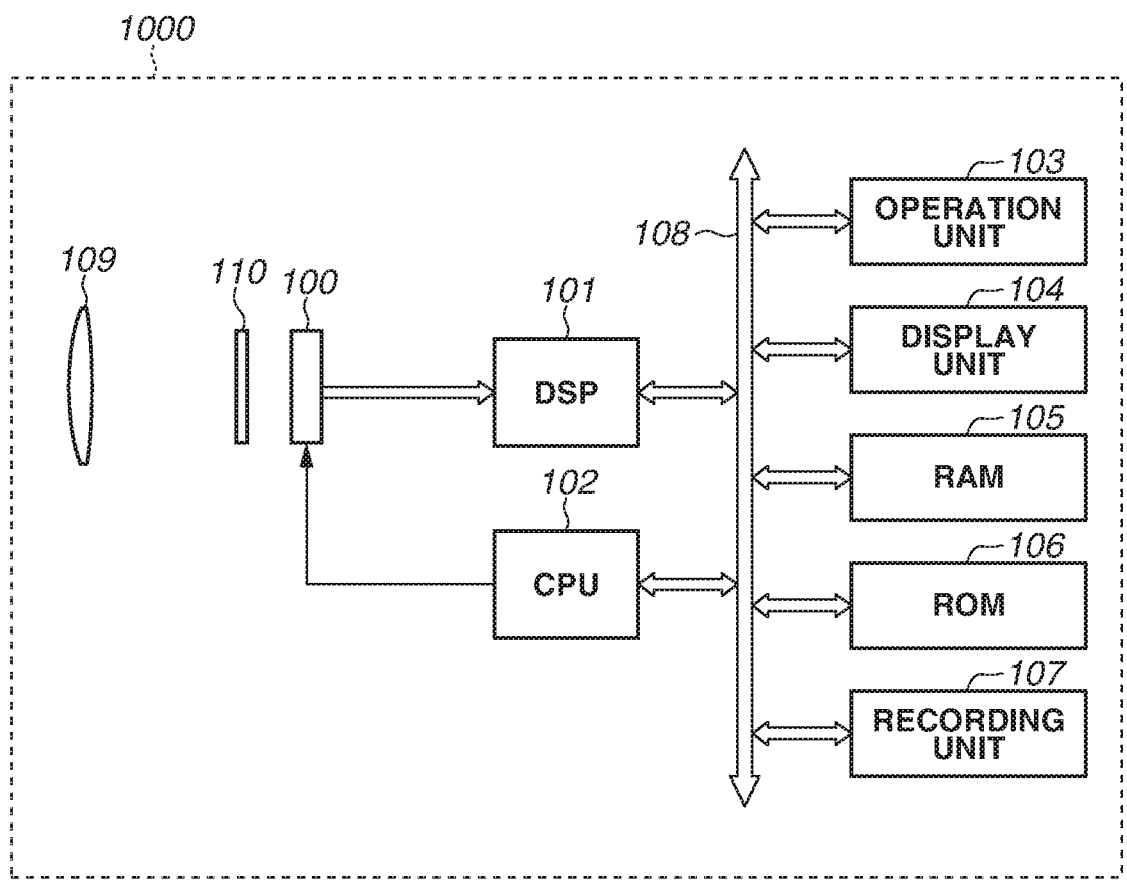
FIG. 1 is a diagram illustrating a configuration of an imaging apparatus according to each of exemplary embodiments.

In the following description, an imaging apparatus according to a first exemplary embodiment will be described with reference to FIG. 1. FIG. 1 is a block diagram illustrating an example of a configuration of the imaging apparatus according to each of exemplary embodiments. An imaging apparatus 1000 according to the present exemplary embodiment is, for example, a digital camera, and has a still image capturing function and a moving image capturing function. In the still image capturing function, the imaging apparatus 1000 can generate still image data in the Joint Photographic Experts Group (JPEG) format and also acquire still image data in the uncompressed RAW format. Further, in the moving image capturing function, the imaging apparatus 1000 can acquire moving image data in the 4 thousand (4K) format or the 8 thousand (8K) format at a frame rate of 30 frames per second or higher.

The imaging apparatus 1000 includes a central processing unit (CPU) 102, which comprehensively controls each function of the imaging apparatus 1000, and an image sensor 100, on which an optical image is formed after passing through an image capturing lens 109. The image sensor 100 converts the optical image formed thereon into an electric signal (an analog pixel signal), and, after that, converts the electric signal into digital image data according to a predetermined quantization bit rate and then output it. The image sensor 100 according to the present exemplary embodiment is a complementary metal-oxide semiconductor (CMOS)-type image sensor including a plurality of pixels in horizontal and vertical directions. The image sensor 100 has pixels as many as a number sufficient to acquire the moving image in the 8K format, and has, for example, 32 million or more pixels. Further, the image sensor 100 may be configured to include a micro lens and a plurality of photoelectric conversion units at each of the pixels to increase light collection efficiency. For example, in a case of a configuration in which two photoelectric conversion units are provided at one pixel (a dual pixel), a further fast operation is required because an output signal amount increases to approximately twice the amount of a normal configuration. The CPU 102 may be a device, a processor, or a circuit that may execute a program or instructions to perform operations described in the following. Further, the CPU 102 sets various kinds of setting parameters and the like to each component. The CPU 102, for example, sets various kinds of parameters for driving and supplies a timing signal that controls an output timing to the image sensor 100. Further, the CPU 102 realizes each processing procedure described in the present exemplary embodiment that will be described below by executing a program recorded in a memory that will be described below. Further, the CPU 102 includes a system memory, and, for example, a random access memory (RAM) is used as the system memory. For example, a constant, a variable, and a program read out from a nonvolatile memory or the like for various operations are developed into the system memory. The nonvolatile memory is an electrically erasable and recordable memory, and, for example, a flash memory is used as the nonvolatile memory. The imaging apparatus 1000 may be configured in such a manner that, for example, a constant, a program, and the like for an operation of the CPU 102 are stored in the nonvolatile memory. The program described here refers to a program for performing various kinds of processing procedure in flowcharts that will be described below in the present exemplary embodiment. Besides executing the program, the CPU 102 may also be configured to include a hardware circuit formed by a reconfigurable circuit or the like.

A digital signal processor (DSP) 101 is a signal processing processor, device, or unit that receives the image data from the image sensor 100 and performs correction processing, compression processing, and the like as appropriate. The imaging apparatus 1000 includes a shutter 110, and the shutter 110 controls an exposure amount to the image sensor 100 according to an image capturing condition. The DSP 101 is being described as a different configuration from the CPU 102 in the present exemplary embodiment, but, in practice, may be configured as one integrated circuit (IC) chip or may be configured as a lamination-type image sensor acquired by integrating a part of functions of the DSP 101 and the image sensor 100 into one IC chip. Further, a static random access memory (SRAM) or the like may be provided to the DSP 101 and used as a buffer for communication with the image sensor 100. The DSP 101 and the CPU may individually or collectively perform operations when executing the program or programs or instructions stored in the memory or memories (e.g., system memory, ROM 106) to function as various units such as a reception unit, a control unit, an image processing unit, a detection unit, and a locking unit. The units may correspond to hardware components (e.g., specialized circuits) or software functionalities that perform the operations described in the following such as in the flowcharts.

A RAM 105 is an image memory for storing the image data output from the image sensor 100 and the image data processed by the DSP 101. The RAM 105 is also used as a work memory of the CPU 102. The RAM 105 is used as the memory for the image data and the work memory in the present exemplary embodiment, but another memory may be used as long as no problem arises with an access speed. A read only memory (ROM) 106 stores therein a program that runs on the CPU 102. A flash ROM is used as the ROM 106 in the present exemplary embodiment, but another memory may be used as long as no problem arises with an access speed.

An operation unit 103 includes a main switch for starting up the imaging apparatus 1000 and an image capturing switch that is used for a user to instruct the imaging apparatus 1000 to capture the still image or the moving image, and is also used when the image capturing condition or the like is set. A display unit 104 displays the still image or the moving image according the image data and also displays a menu and the like under control by the CPU 102. Further, the operation unit 103 may include a switching switch for switching a still image mode and a moving image mode, a touch panel on a surface of the display unit 104, and the like.

A recording unit 107 is, for example, a nonvolatile memory or a hard disk, and records the image data and the like therein. According to the present exemplary embodiment, the recording unit 107 is built in the imaging apparatus 1000. Alternatively, the imaging apparatus 1000 may be an external recording medium such as a memory card attachable to the imaging apparatus 1000 via a connector or the like.

The imaging apparatus 1000 includes a bus 108, and data is transmitted and received between the DSP 101, the CPU 102, and another circuit via this bus 108.

Figure 2A:
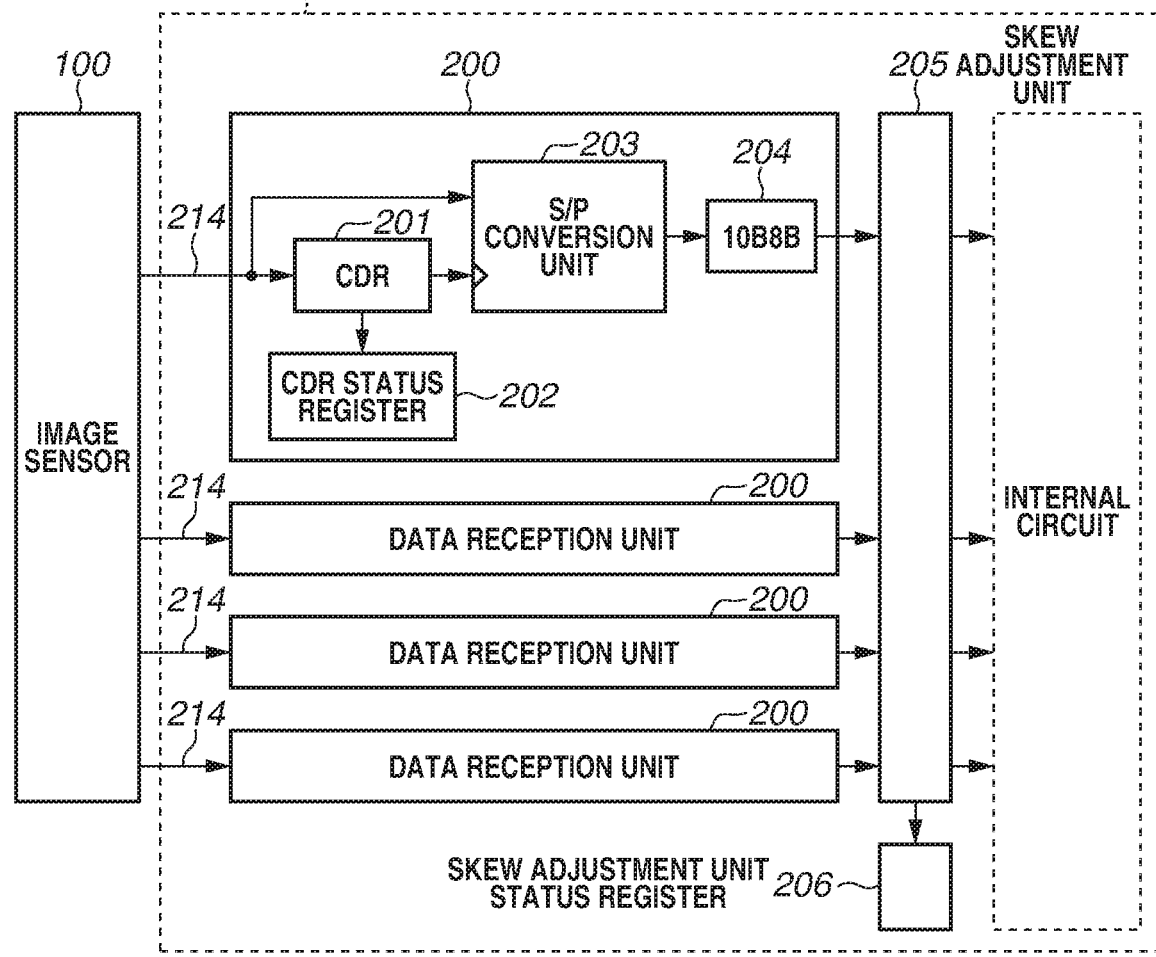
FIGS. 2A and 2B are diagrams illustrating a configuration of a data reception unit according to each of the exemplary embodiments.
Figure 2B:
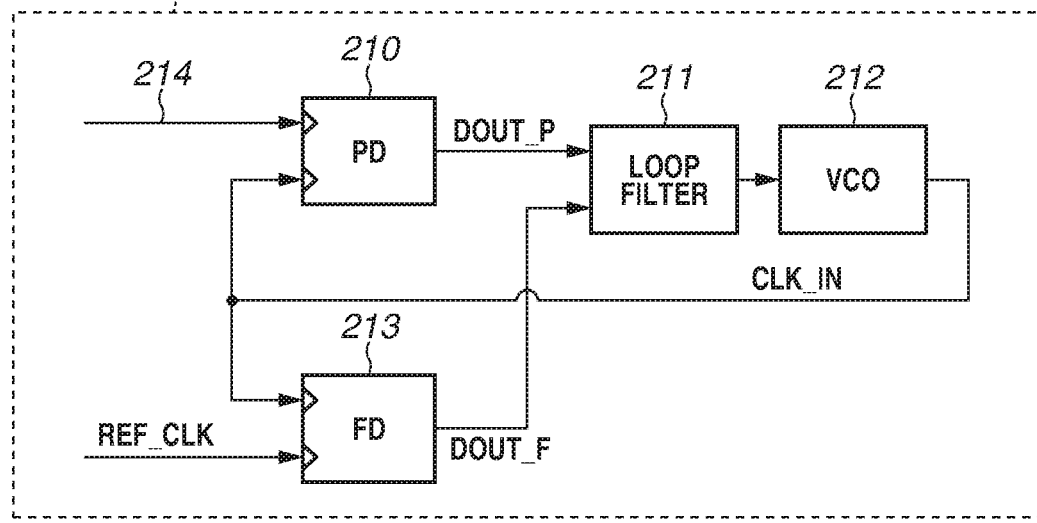

Next, a connection between the image sensor 100 and the DSP 101 will be described in detail with reference to FIGS. 2A and 2B. FIG. 2A illustrates an example of a configuration of a part of circuits involved in the image data reception and a connection with the image sensor 100 with respect to the DSP 101. According to the present exemplary embodiment, the image data is input from the image sensor 100 to the DSP 101 with use of communication based on a clock embedded procedure. This image data is received by a data reception unit 200. The data reception unit 200 may be a circuit, a device, a data receiver, or a programmable functionality. According to the present exemplary embodiment, the image sensor 100 includes four output lanes, and divides one piece of image data or a plurality of pieces of image data in correspondence with the number of lanes and transmits the data lane by lane. According to the present exemplary embodiment, each of the output lanes of the image sensor 100 includes a not-illustrated transmission unit corresponding thereto. Then, each of the lanes forms a differential pair, and has a communication band of approximately 3 Gbps or more. The data reception unit 200 is connected to each of the lanes, and the data is received independently for each of the data reception units 200. The number of lanes is four in the present exemplary embodiment. Alternatively, the number of data lanes may be larger than that and/or the imaging apparatus 1000 may be configured to switch the number of lanes to use according to a transfer rate of the image data.

The data reception unit 200 includes a clock data recovery (CDR) circuit 201, a serial/parallel (S/P) conversion unit 203, a 10 bit(B)-8B conversion unit 204, and a CDR status register 202. The CDR circuit 201 reproduces a clock based on the signal input from the image sensor 100 (input data). The S/P conversion unit 203 carries out a serial/parallel conversion on the input data to generate parallel data based on the clock reproduced by the CDR circuit 201. After that, the parallel data is subjected to a 10B-8B conversion by the 10B-8B conversion unit 204, and is input to a skew adjustment unit 205 at a subsequent stage.

A configuration of the CDR circuit 201 and an operation (a locking operation) thereof will be described in detail with reference to FIGS. 2B, and 3A and 3B. The CDR circuit 201 includes a frequency detector (FD) 213, a phase detector (PD) 210, a loop filter 211, and a voltage control oscillator (VCO) 212. Serial data 214 indicates the data input from the image sensor 100 based on a clock embedded procedure. The clock-embedded procedure is a procedure or a method that includes or embeds a clock signal or clock signals as part of the control function. One objective of using the clock-embedded procedure is to provide proper timings or synchronism of various signals in the circuit. The serial data 214, which is transmitted as the image data from the image sensor 100, is input to the CDR circuit 201. Further, the CDR circuit 201 generates a serial clock signal CLK_IN locked to the serial data 214 by a frequency locked loop realized by the frequency detector 213 and a phase locked loop realized by the phase detector 210. Then, the generated serial clock signal CLK_IN is output to the S/P conversion unit 203 that receives and processes the serial data 214, and is used as a clock for converting the received serial data to parallel data.

Now, the frequency locked loop will be described. The frequency detector 213 receives a not-illustrated reference clock signal REF_CLK and the serial clock signal CLK_IN as inputs, and outputs frequency detection information DOUT_F of n bits to the loop filter 211 as a digital value. The reference clock signal REF_CLK is a first clock signal, and is supplied from outside the CDR circuit 201. Further, the serial clock signal CLK_IN is a second clock signal, and is generated by the VCO 212.

The loop filter 211 is formed by a digital filter, and removes noise in an unnecessary band and amplifies a signal in a necessary band to output a result thereof by filtering the frequency detection information DOUT_F. The VCO 212 is a VCO including a built-in digital/analog converter (DAC), and controls a frequency of the serial clock signal CLK_IN based on the output from the loop filter 211 and outputs the serial clock signal CLK_IN to the frequency detector 213. The serial clock signal CLK_IN is fed back to the frequency detector 213. Due to this loop control, the serial clock signal CLK_IN can be frequency-locked to the reference clock signal REF_CLK at a ratio that multiplies the reference clock signal REF_CLK. According to the present exemplary embodiment, this loop control is referred to as the frequency locked loop.

Further, a frequency of the reference clock signal REF_CLK has a predetermined division ratio to a frequency corresponding to a data rate of the serial data 214. As a result, the frequency of the serial clock signal CLK_IN can be entrained to a frequency extremely close to the serial data 214. More specifically, for example, if the data rate of the serial data 214 is several Gbps, the frequency of the serial clock signal CLK_IN can be entrained to within a range as close as a frequency difference of several MHz. How close the frequency can be entrained to the serial data 214 depends on, for example, an error from the frequency of the reference clock signal REF_CLK and a gain of the frequency locked loop with respect to a frequency into which several GHz, which is the frequency corresponding to the data rate of the serial data 214, is divided.

If the frequency of the serial clock signal CLK_IN can be entrained to within the range as close as the frequency difference of approximately several MHz by the above-described frequency locked loop, a phase lock can be achieved by the phase locked loop, which will be described below. In the following description, the phase locked loop will be described in detail.

The serial data 214 and the serial clock signal CLK_IN are input to the phase detector 210. Phase error information DOUT_P between the serial data 214 and the serial clock signal CLK_IN is detected as a digital value. Then, the loop filter 211 removes noise in an unnecessary band and amplifies a signal in a necessary band to output a result thereof by filtering the phase error information DOUT_P. The VCO 212 controls the frequency of the serial clock signal CLK_IN based on the output from the loop filter 211 and outputs the serial clock signal CLK_IN to the phase detector 210. The serial clock signal CLK_IN is fed back to the phase detector 210. The serial data 214 and the serial clock signal CLK_IN are phase-locked to each other by this loop control. This loop control is referred to as the phase locked loop. As a result, the serial clock signal CLK_IN is controlled so as to have the same frequency and phase as the serial data 214.

Figure 3A:
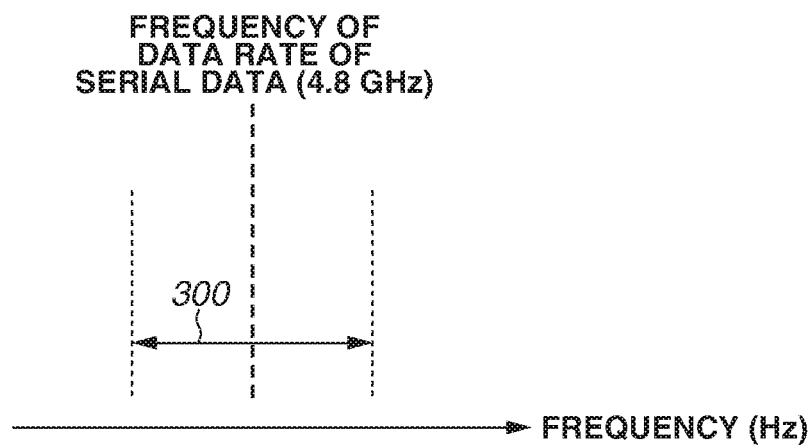
FIGS. 3A and 3B are diagrams illustrating a concept of an operation of the data reception unit according to each of the exemplary embodiments.

FIG. 3A illustrates a frequency range in which the serial clock signal CLK_IN can be phase-locked with use of only the phase locked loop realized by the phase detector 210 without use of the frequency detector 213. The frequency corresponding to the data rate of the serial data 214 is, for example, 4.8 GHz. A region 300 is a frequency range in which the serial clock signal CLK_IN can be phase-locked, and is, for example, approximately several MHz.

The frequency range in which the serial clock signal CLK_IN can be phase-locked can be expanded by providing the frequency locked loop realized by the frequency detector 213 besides the phase locked loop realized by the phase detector 210.

Figure 3B:
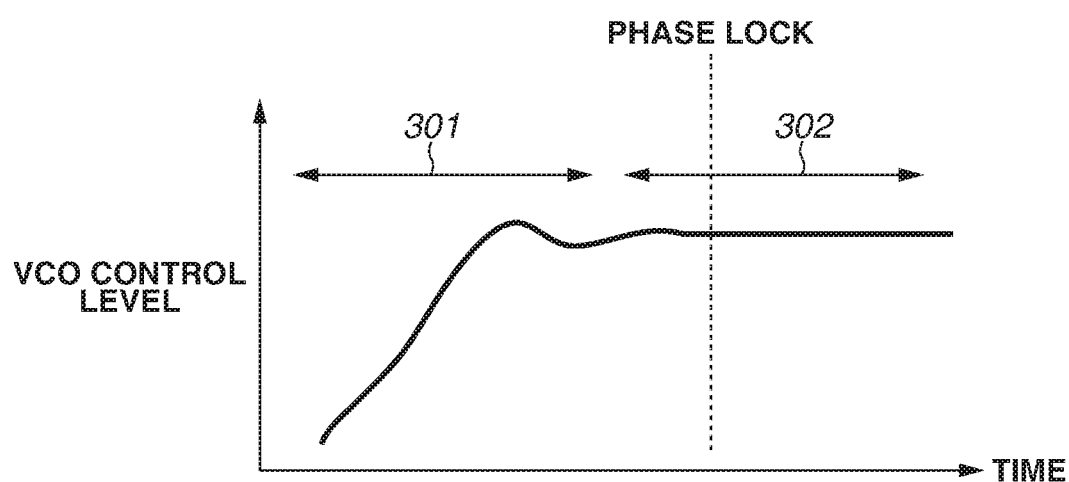

FIG. 3B illustrates how a transient response looks like until the serial clock signal CLK_IN is phase-locked by the frequency locked loop realized by the frequency detector 213 and the phase locked loop realized by the phase detector 210. A region 301 is a range where the VCO 212 is controlled mainly by the frequency locked loop. When the frequency becomes able to be sufficiently entrained by the phase locked loop in the region 301, the loop control transitions from the region 301 to a region 302. A region 302 is a range where the VCO 212 is controlled by the phase locked loop.

A result of whether the loop control is ended normally as far as the phase lock is written into the CDR status register 202. If the loop control is ended normally, 1 is written into the CDR status register 202. If the loop control is not ended normally due to an influence of power source noise or the like, 0 is written. According to the present exemplary embodiment, whether the loop control is ended normally is determined based on whether a change in an output voltage of the VCO 212 matches or falls below a predetermined change amount, and the result is written into the CDR status register 202 by a predetermined logic circuit. The determination method is not limited thereto, and the determination may be made by comparing the frequency itself or may be made from the result of DOUT_P or DOUT_F.

The data processed by each of the data reception units 200 is adjusted as the output data in such a manner that a difference (a skew) among the pieces of data in the lanes is canceled based on a reference code included in the data in each of the lanes at the skew adjustment unit 205. The data unskewed at the skew adjustment unit 205 is transferred to an internal circuit in the DSP 101 and is subjected to predetermined image processing such as a signal correction and signal compression processing. Further, the DSP 101 may be configured to buffer each of the pieces of data into a memory or the like before processing it via the predetermined processing according to a predetermined timing.

According to the present exemplary embodiment, the result of whether the skew adjustment for each of the lanes is ended normally is written into a skew adjustment status resister 206. If the skew adjustment is ended normally, 1 is written into the skew adjustment status register 206. On the other hand, if the skew adjustment is not ended normally due to the influence of the power source noise or the like, 0 is written. Whether the skew adjustment is ended normally is determined based on the difference in the reference code input to each of the lanes in the present exemplary embodiment. If the difference is eliminated in all of the lanes, the value is written into the skew adjustment status register 206 by a predetermined logic circuit.

According to the present exemplary embodiment, the above-described series of operations from the clock reproduction operation by the CDR circuit 201 to the skew adjustment operation by the skew adjustment unit 205 will be referred to as a training operation, and a time period during which the training operation is performed will be referred to as a training time period (a locking time period). However, the operations included in the training time period are not limited thereto, and the training time period may include an operation other than them or the imaging apparatus 1000 may also employ a configuration that performs only the clock reproduction operation. According to the present exemplary embodiment, the result of the locking operation is written into the CDR status register 202 and the skew adjustment status register 206, whereby the lock state (the locking result) can be detected based on this value. According to the present exemplary embodiment, each of the registers corresponds to a detection unit, and the value thereof corresponds to a detection result.

Figure 4:
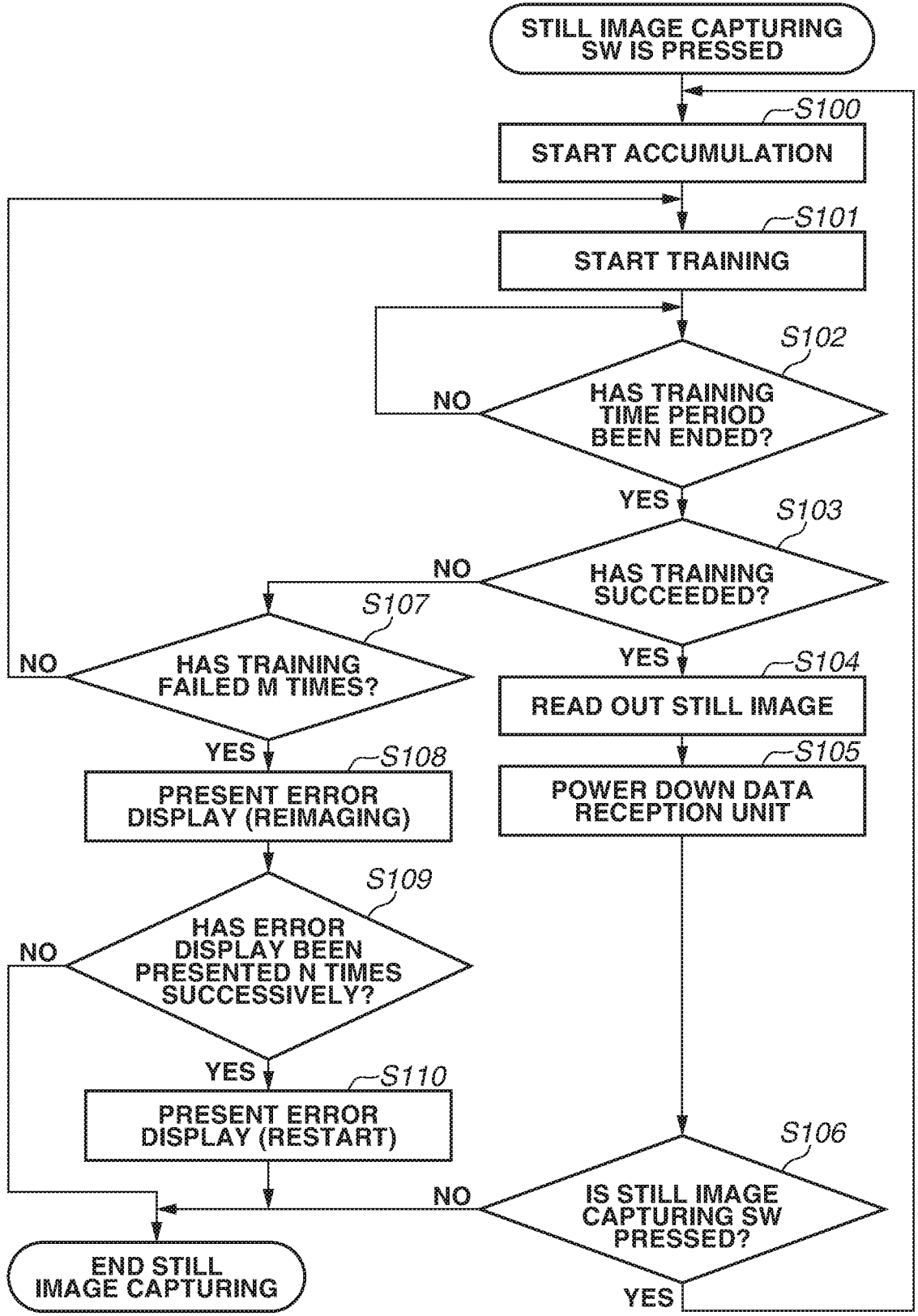
FIG. 4 is a flowchart illustrating an operation of the imaging apparatus according to a first exemplary embodiment.
Figure 5A:
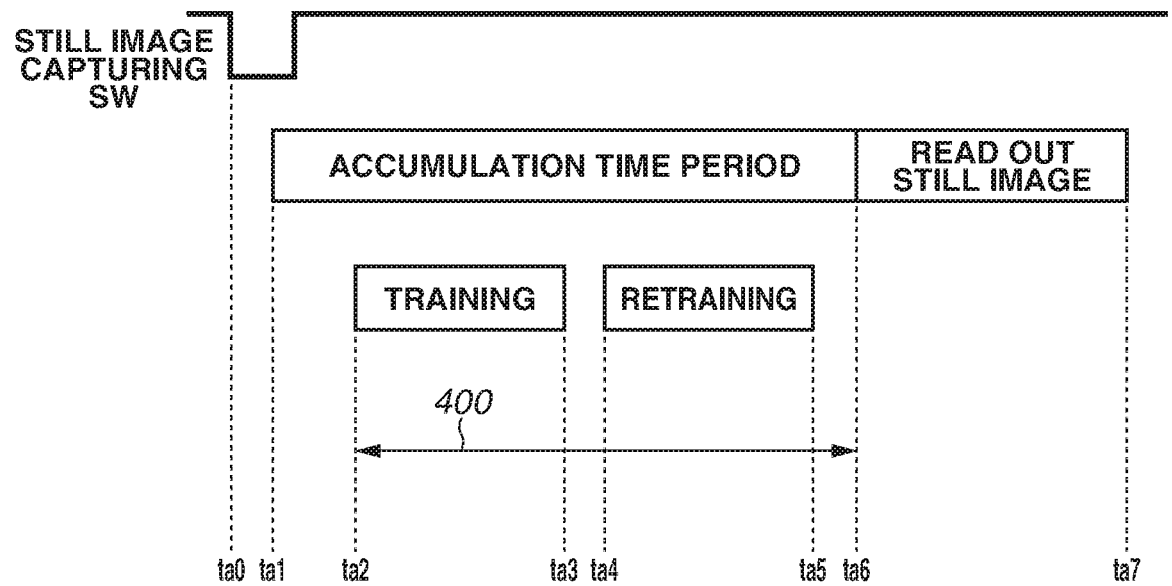
FIGS. 5A and 5B are timing charts illustrating the operation of the imaging apparatus according to the first exemplary embodiment.

Next, the training operation of the imaging apparatus 1000 according to the present exemplary embodiment will be described in detail with reference to FIGS. 4 and 5A. FIG. 4 is a flowchart illustrating the still image capturing operation by the imaging apparatus 1000 according to the present exemplary embodiment. For each process in the present flowchart, the CPU 102 executes a process, a functionality, a program, a module, or a set of instructions, in each of steps while controlling each of the components. FIG. 5A is a diagram illustrating operation timings during the training operation according to the present exemplary embodiment. The timings (ta0 to ta7) illustrated in FIG. 5A correspond to each of portions in the flowchart illustrated in FIG. 4. In the following description, each of the steps illustrated in FIG. 4 will be described, indicating steps corresponding to the operation timings illustrated in FIG. 5A by adding a description thereof.

First, when the user or the like presses a still image capturing switch (SW) included in the operation unit 103 (ta0 in FIG. 5A), each of still image capturing operations illustrated in FIG. 4 is performed. In step S100, the CPU 102 transmits a setting for starting accumulation of charges to the image sensor 100, to start accumulation control (ta1 in FIG. 5A). Then, the processing proceeds to step S101. Now, the accumulation control includes an accumulation start operation and an accumulation end operation. The accumulation start operation in the present exemplary embodiment is a so-called electronic shutter operation, and corresponds to applying a reset operation to each of the pixels arranged on a light-receiving surface of the image sensor 100. Further, the accumulation end operation corresponds to an operation of reading out the signal, but the accumulation operation may be ended by shielding the image sensor 100 from light with use of a mechanical shutter or the like. Alternatively, the accumulation of charges may include a plurality of accumulation start operations and a plurality of accumulation end operations in one accumulation control procedure in the control.

Next, in step S101, the CPU 102 performs control to start the training. More specifically, the CPU 102 sets the image sensor 100 to output data for the training, and sets each of the data reception units 200 to start the training by the above-described operation after that (ta2 in FIG. 5A). The data for the training refers to known dummy data, but a part of the actual image data may be used as the data for the training. Then, the processing proceeds to step S102.

In step S102, the CPU 102 determines whether the training time period has been ended. According to the present exemplary embodiment, the training time period has been already ended by the time after a predetermined time has passed, the CPU 102 determines the end of the training time period based on whether this time has passed. If the training time period has not been ended (NO in step S102), the processing returns to step S102. If the training time period has been ended (YES in step S102), the processing proceeds to step S103 (ta3 in FIG. 5A). The predetermined time for determining the end of the training time period may be any of a fixed time or a variable time, and may be set to a relatively long time under such circumferences that a large amount of noise would occur and may be prepared to set the training time period to a short time when a quick response operation is required.

Figure 5B:
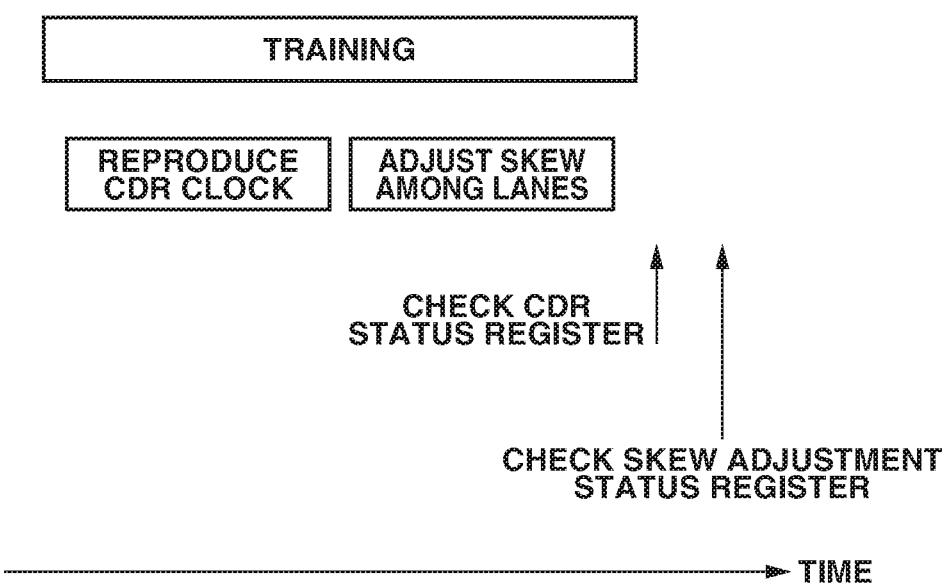

In step S103, the CPU 102 determines whether the training has been ended without any problem with the training. More specifically, the CPU 102 checks the CDR status registers 202 and the skew adjustment status registers 206 of all of the data reception units 200 (FIG. 5B). If 1 is written in all of the registers, the CPU 102 determines that the training has been ended normally (YES in step S103), and the processing proceeds to step S104. The CPU 102 may be configured to determine whether the training has succeeded based on only any one of the CDR status register 202 and the skew adjustment status register 206. Further, in a case of an operation not using all of the lanes, the CPU 102 may perform control to check only the CDR status register 202 of the data reception unit 200 corresponding to the lane in use.

In step S104, the image data for the still image is read out from the image sensor 100 (ta6 in FIG. 5A). In this process, if the training operation has been ended without any problem in step S103, the data transmission/reception has been established between the image sensor 100 and the DSP 101. Therefore, when the CPU 102 sets the image sensor 100 to output the image data, the image data is sequentially output from each of the lanes of the image sensor 100. The image data output from the image sensor 100 is transferred to the not-illustrated internal circuit in the DSP 101 via the data reception unit 200 and the skew adjustment unit 205. In the DSP 101, the image data is developed after being subjected to the correction processing and the like, and is recorded into the recording unit 107 as the still image. Then, the processing proceeds to step S105.

In step S105, the CPU 102 performs processing for powering down each of the data reception units 200. More specifically, the CPU 102 stops the clocks directed to the data reception units 200 and the skew adjustment unit 205 after the end of the readout of the image data. Due to this stop, the internal operation is stopped and the data reception units 200 are brought into a powered-down state (a power saving state). As a result, the imaging apparatus 1000 can reduce power consumed during a time period until the data is received from the image sensor 100 next time. During this time period, the CPU 102 also sets the image sensor 100 so as to power down it. Then, the processing proceeds to step S106. The CPU 102 performs processing for returning the stopped clocks and recovers the data reception units 200 from the powered-down state to a normal operation state in the training operation although this has been omitted in the description of step S101. Other than stopping the clocks, the CPU 102 may also perform control to stop power to supply as the control for bringing the data reception units 200 into the powered-down state. Stopping power to supply is accompanied by such a demerit that it takes a long time until the recovery, but allows the imaging apparatus 1000 to acquire a high power saving effect.

In step S106, the CPU 102 determines whether the still image capturing SW is continuously pressed. If the still image capturing SW is continuously pressed in this process (YES in step S106), the CPU 102 determines that an operation of continuously capturing the still image is in progress and the processing returns to step S100. On the other hand, if the still image capturing SW is not pressed in step S106 (NO in step S106), the CPU 102 ends the still image capturing.

The processing when the training operation has not been ended normally in step S103 will be described. As already described, in step S103, the CPU 102 determines whether the training operation has been ended without any problem. Then, the CPU 102 checks the CDR status registers 202 and the skew adjustment status registers 206 of all of the data reception units 200. If 0 is written in even only one register with respect to any of the registers, the CPU 102 determines that the training has not been ended normally. Then, the processing proceeds to step S107.

In step S107, the CPU 102 determines whether the number of times that the training operation has failed successively reaches M times, which is a preset number of times. If the number of times of failures does not reach M times as a result of the determination (NO in step S107), the CPU 102 increments a count of the number of times of failures by one and the processing returns to step S101 (ta4 in FIG. 5A). The CPU 102 repeats the training operation a plurality of times until the training operation has succeeded in this operation. The number of times that the training operation is repeated in the present exemplary embodiment (the above-described number of times, M times) is predetermined in such a manner that the repetition is completed within a time since the training operation is started for the first time until the readout of the still image is started (400 in FIG. 5A). It is desirable to set, for example, M=2 or more, but a sufficient retraining time period may be unable to be secured when, for example, the accumulation time is short as apparent from FIG. 5A. Therefore, the number of times that the training operation is repeated may be variable according to the image capturing condition (the accumulation time, an International Organization Standards (ISO) sensitivity, and the like) and a frame rate (a length of a blanking time period). If the training operation has failed successively and the count of the number of times of failures reaches M times in step S107 (YES in step S107), the processing proceeds to step S108. The CPU 102 makes the determination in step S107 by determining whether the error has been determined in step S103 successively, but may be configured to make the determination in step S107 based on a cumulative number of times.

In step S108, the CPU 102 displays a message prompting the user to perform the image capturing operation again, which is a content illustrated in FIG. 6A, on the display unit 104. After that, the processing proceeds to step S109. The display of the message indicating the abnormality in the present exemplary embodiment corresponds to error processing. Another method other than the method that displays the message may be used as the method for the error processing. For example, audio may be played back or an indicator lamp or the like may be lightened up. Alternatively, a plurality of methods may be combined as long as they constitute another method for issuing the instruction to the user.

In step S109, the CPU 102 determines whether the number of times that the error display (FIG. 6A) has been presented due to the failure to capture the image normally in step S108 successively reaches N times, which is a preset number of times. If the number of times of display does not reach N times (NO in step S109), the CPU 102 increments a count of the number of times of display by one, and ends the still image capturing. On the other hand, if the number of times that the error display (FIG. 6A) has been presented due to the failure to capture the image normally reaches N times in step S109 (YES in step S109), the processing proceeds to step S110. The CPU 102 makes the determination in step S109 by determining whether the error display has been presented in step S108 successively, but may be configured to make the determination in step S109 based on a cumulative number of times. Further, it is desirable that the number of times for use in the determination (N) is twice or more, but this number of times may be variable according to, for example, the situation of the failure in the training operation in step S103. Further, the imaging apparatus 1000 may be configured to store the situation of the failure into the ROM 106 or the like.

In step S110, the CPU 102 displays a message illustrated in FIG. 6B on the display unit 104, and ends the still image capturing.

The above-described operation allows the imaging apparatus 1000 to conduct the retraining even when the training of the serial data transmission has failed within the image capturing operation, and the image can be therefore captured at a timing intended by the user. Further, conducting the training within the image capturing operation allows the imaging apparatus 1000 to keep the circuits involved in the serial data transmission into the powered-down state except during the image capturing operation, and the power consumption can be reduced. At least a time period that allows the training operation to be performed as many times as the number of times of failures (M times) should be prepared as the time period during which the training operation is performed, so that the training operation should be performed sufficiently before the timing at which the still image is read out (ta6 in FIG. 5A). This case leads to a reduction in a time period during which the circuits involved in the serial data transmission can be kept in the powered-down state, and therefore it is desirable to determine the time period during which the training operation is performed according to whether priority is placed on the time period during which the circuits can be kept in the powered-down state.

As a cause for the failure in the training operation in the present exemplary embodiment, it is also possible that the training operation has failed because it had taken a longer time than expected until the phase lock as illustrated in FIG. 3B. In such a case, the CPU 102 may perform control to extend the time period during which the training operation is performed by extending the time to the phase lock when the training operation has failed the predetermined number of times (M times).

Further, in the present exemplary embodiment, when the training operation has failed the predetermined number of times (M times), the imaging apparatus 1000 can prompt the user to capture the image again by presenting the error display and notifying the user of the failure to capture the image. Normally, the user cannot determine whether the training operation has failed, and capturing the image without correcting this state results in repeated capturing of an abnormal image and may lead to a malfunction of the device in the worst case. Further, the operation described in the present exemplary embodiment allows the imaging apparatus 1000 to present the different error display according to the occurrence of the state incapable of capturing the image the predetermined number of times (N times), whereby the user is prompted to attempt to establish a state capable of capturing the image again. This allows the imaging apparatus 1000 to not only prevent the user from missing a shutter timing with the abnormal image captured repeatedly but also appropriately notify the user that the abnormality has occurred in the device.

The still image capturing operation has been described with reference to the flowchart in the present exemplary embodiment, but similar processing can also be performed when the moving image is captured.

The messages displayed on the display unit 104 that are illustrated in FIGS. 6A and 6B are an example, and the imaging apparatus 1000 may present a different display or may notify the user simply by the operation of lightning up the indicator lamp.

In the following description, an operation of the imaging apparatus 1000 according to a second exemplary embodiment will be described with reference to FIG. 7. The imaging apparatus 1000 according to the present exemplary embodiment is configured similarly to the configuration described in the first exemplary embodiment, and will be described assigning the same reference numerals to similar configurations or operations and omitting descriptions thereof.

Figure 7:
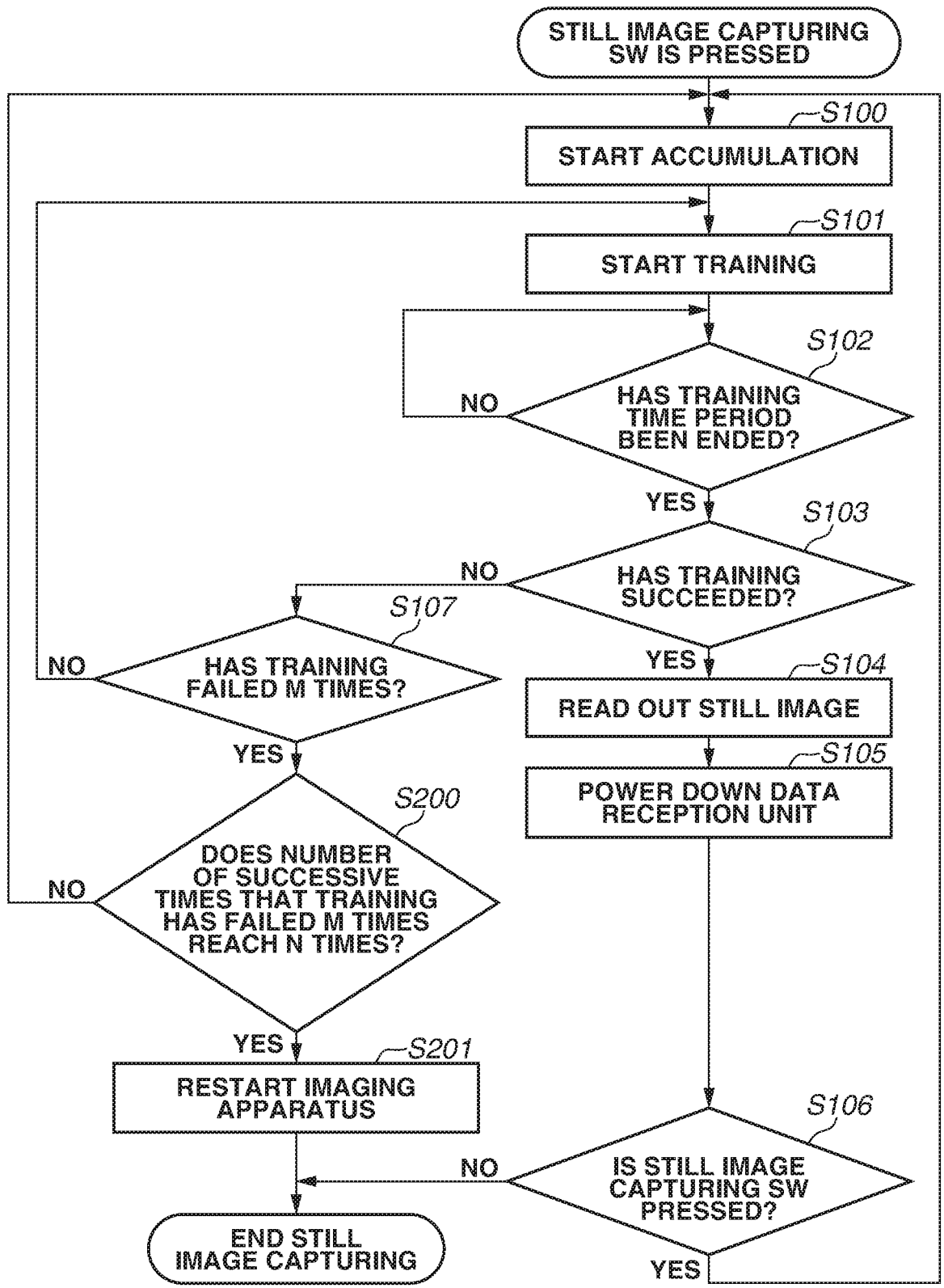
FIG. 7 is a flowchart illustrating an operation of the imaging apparatus according to a second exemplary embodiment.

FIG. 7 is a flowchart illustrating the still image capturing operation by the imaging apparatus 1000 according to the present exemplary embodiment. For each process in the present flowchart, the CPU 102 executes a process, a functionality, a program, a module, or a set of instructions, in each of steps while controlling each of the components. FIG. 7 according to the present exemplary embodiment corresponds to FIG. 4 according to the first exemplary embodiment, and operations numbered with the same numbers are similar to the operations described in the first exemplary embodiment and therefore descriptions thereof will be omitted below. In the following description, operations in step S107 and steps subsequent thereto will be described in detail.

In step S107, the CPU 102 determines whether the number of times that the training operation has failed successively reaches M times, which is the preset number of times. If the training operation has failed successively and the count of the number of times of failures reaches M times (YES in step S107), the processing proceeds to step S200.

If the number of successive times that the training has failed M times due to the failure to capture the image normally in step S107 reaches N times in step S200 (YES in step S200), the processing proceeds to step S201. In step S201, the CPU 102 performs processing for restarting the imaging apparatus 1000 and ends the still image capturing operation. On the other hand, if the number of successive times that the training has failed M times due to the failure to capture the image normally does not reach N times in step S200 (NO in step S200), the processing returns to step S100 and the CPU 102 carries out the image capturing again.

The above-described operation allows the imaging apparatus 1000 to conduct the retraining even when the training of the serial data transmission has failed within the image capturing operation, and the image therefore can be captured at the timing intended by the user. Further, the above-described operation allows the imaging apparatus 1000 to be restarted according to the occurrence of the state incapable of capturing the image and the failure in the training the predetermined number times, and the state capable of capturing the image therefore can be established without requiring the user to engage in cumbersome work. The CPU 102 makes the determination in step S200 by determining whether the determination in step S107 has been repeated successively, but may be configured to make the determination in step S200 based on the cumulative number of times. Further, it is desirable that the number of times for use in the determination (N) is twice, but this number of times may be variable according to, for example, the situation of the failure in the training operation in step S103.

In the following description, an operation of the imaging apparatus 1000 according to a third exemplary embodiment will be described with reference to FIGS. 9 and 10. The first exemplary embodiment and the second exemplary embodiment have been described focusing on the training operation in the still image capturing operation. The present exemplary embodiment will be described focusing on a training operation when a live view (LV) operation for determining an angle of view and the image capturing condition is performed. The imaging apparatus 1000 according to the present exemplary embodiment is configured similarly to the configuration described in the first exemplary embodiment, and will be described assigning the same reference numerals to similar configurations or operations and omitting descriptions thereof.

Figure 9:
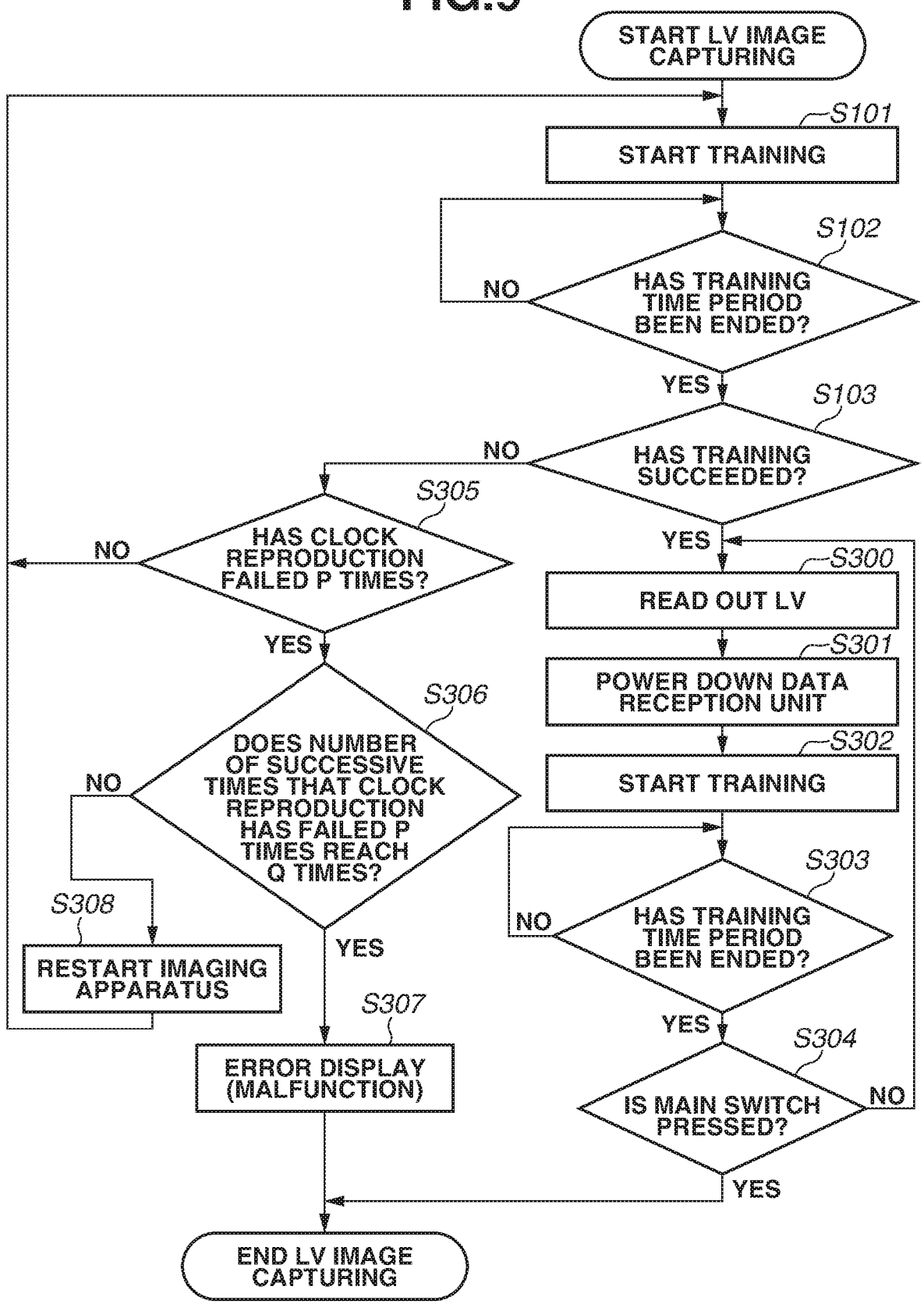
FIG. 9 is a flowchart illustrating an operation of the imaging apparatus according to the third exemplary embodiment.

FIG. 9 is a flowchart illustrating the still image capturing operation by the imaging apparatus 1000 according to the present exemplary embodiment. For each process in the present flowchart, the CPU 102 executes a process, a functionality, a program, a module, or a set of instructions, in each of steps while controlling each of the components. FIG. 9 according to the present exemplary embodiment corresponds to FIG. 4 according to the first exemplary embodiment, and operations numbered with the same numbers are similar to the operations described in the first exemplary embodiment and therefore descriptions thereof will be omitted below. In the following description, operations in step S103 and steps subsequent thereto will be described in detail.

Operations numbered with the same numbers as FIG. 4 described in the first exemplary embodiment are similar to the operations described in the first exemplary embodiment, and therefore descriptions thereof will be omitted below.

Figure 10:
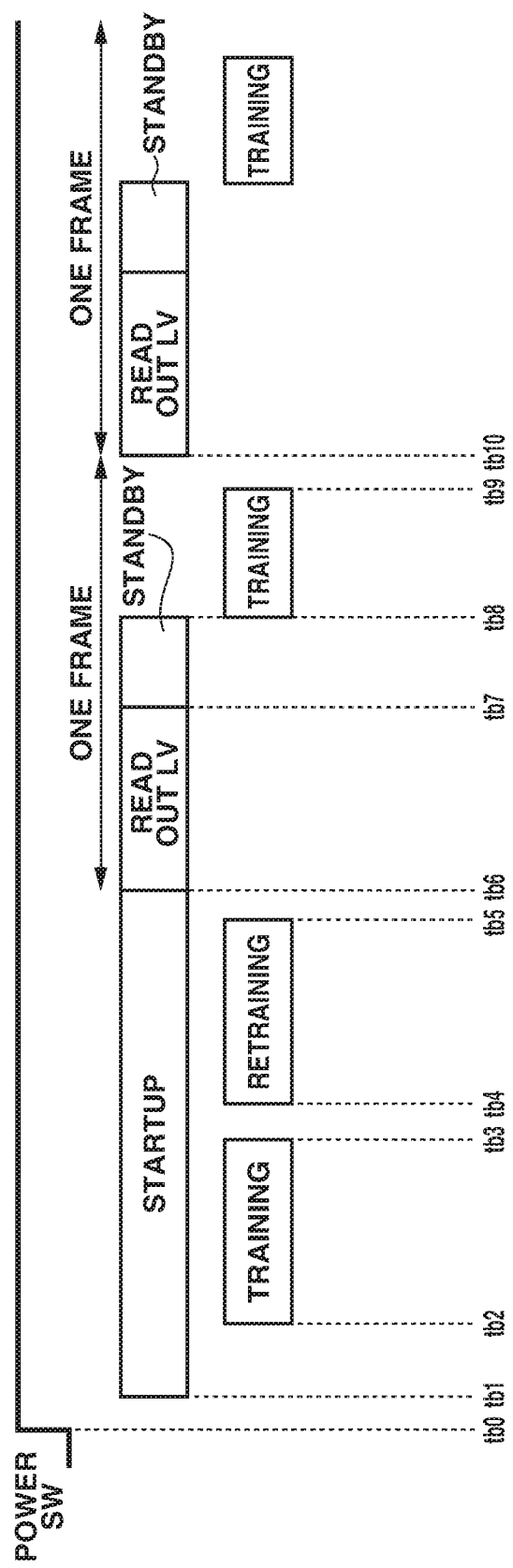
FIG. 10 is a timing chart illustrating the operation of the imaging apparatus according to the third exemplary embodiment.

When the user presses the main switch included in the operation unit 103 (tb0 in FIG. 10), the imaging apparatus 1000 is started up and starts to capture the image for the live view (LV) (tb1 in FIG. 10). When the LV image capturing operation is started by the CPU 102 at the time of the startup, in step S101, the CPU 102 starts the training operation. Control from step S101 to step S103 in which the training operation is performed is similar to the control described in the first exemplary embodiment, and therefore a description thereof will be omitted here. If the training operation has been ended normally in step S103 (YES in step S103), the processing proceeds to step S300.

In step S300, the CPU 102 reads out the image to be used for the LV by controlling the image sensor 100 (tb6 in FIG. 10). If the training operation has been ended without any problem in step S103 (YES in step S103), the data transmission/reception has been established between the image sensor 100 and the DSP 101. Therefore, when the CPU 102 sets the image sensor 100 to output the image data, the image data is sequentially output from each of the lanes of the image sensor 100. The image data output from the image sensor 100 is transferred to the not-illustrated internal circuit in the DSP 101 via the data reception unit 200 and the skew adjustment unit 205. In the DSP 101, the image data is developed after being subjected to the correction processing and the like, and is displayed onto the display unit 104 as an LV image. Then, the processing proceeds to step S301.

Figure 8:
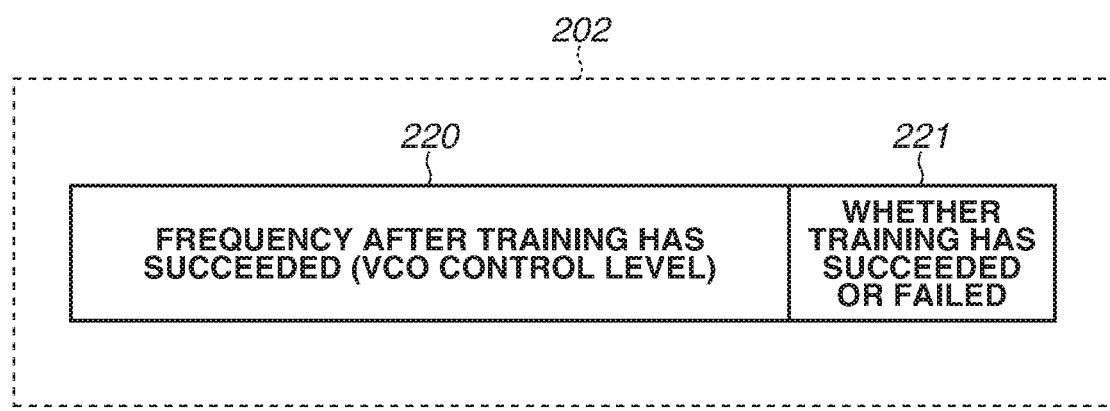
FIG. 8 is a diagram illustrating a configuration of a data reception unit according to a third exemplary embodiment.

In step S301, the CPU 102 performs the processing for powering down each of the data reception units 200 (tb7 in FIG. 10). More specifically, the CPU 102 performs the processing for powering down the data reception units 200 by, for example, stopping the clocks directed to the data reception units 200 and the skew adjustment unit 205 after the end of the readout of the LV image. FIG. 8 illustrates an internal configuration of registers in the CDR status register 202. The value of the frequency phase-locked by conducting the training last time (a VCO control level) is stored in a register 220. Then, this value is also retained during the powered-down time period. Further, the value to be used for the result of the determination about whether the training operation has succeeded or failed is stored in a register 221. The imaging apparatus 1000 can reduce power consumed during the time period until the data is received from the image sensor 100 next time (the blanking time period) by retaining the necessary value in each of the registers. The CPU 102 may be configured to also set the image sensor 100 to power down it during this time period. Next, the processing proceeds to step S302.

In step S302, the CPU 102 starts the training to read out the LV image of the next frame. The training at this time entrains the frequency to the entrainment phase lock in the phase locked loop labeled as the region 302 in FIG. 3B, starting from the value of the frequency stored in the CDR status register 202 (the VCO control level) as a starting frequency. This training operation allows the imaging apparatus 1000 to reduce the time taken to achieve the phase lock, thereby conducting the training even in a short time during which the live view image is read out. On the other hand, this training operation allows the imaging apparatus 1000 to maintain the powered-down state for a long time period. Further, the training in this process is entrainment aiming to entrain a narrow frequency range, and therefore a possibility of the failure in the training reduces compared to the entrainment aiming at a wide range with use of the frequency locked loop. Then, the processing proceeds to step S303.

In step S303, the CPU 102 determines whether the training time period has been ended. According to the present exemplary embodiment, assuming that the training time period has been already ended by the time after the predetermined time has passed, the CPU 102 determines the end of the training time period based on whether this time has passed. If the training time period has not been ended (NO in step S303), the processing returns to step S303. If the training time period has been ended in step S303 (YES in step S303), the processing proceeds to step S304 (tb9 in FIG. 10).

According to the present exemplary embodiment, the training operation has less likely failed as described already, and therefore the imaging apparatus 1000 does not confirm whether the training has succeeded or failed and does not conduct the retraining while repeating the readout of the LV image. This effect allows the imaging apparatus 1000 to conduct the training even in a short time such as the readout of the LV image. Further, this effect also allows the imaging apparatus 1000 to perform the operation with power saved by an amount corresponding to the omission of the confirmation about whether the training has succeeded or failed and the execution of the retraining, and a further power saving effect is therefore acquired. The readout of the LV image has been focused on in the present exemplary embodiment, but the operation of the present exemplary embodiment is also effectively useful at the time of an operation of capturing a moving image at a high frame rate.

In step S304, the CPU 102 determines whether the main switch is pressed. If the main switch is pressed (YES in step S304), the CPU 102 ends the LV image capturing. If the main switch is not pressed (NO in step S304), the processing returns to step S300, and the CPU 102 repeats the LV image capturing.

Next, the processing when the training operation has not been ended normally in step S103 will be described. As already described, in step S103, the CPU 102 determines whether the training operation has been ended without any problem. Then, the CPU 102 checks the CDR status registers 202 and the skew adjustment status registers 206 of all of the data reception units 200. If 0 is written in even only one register with respect to any of the registers, the CPU 102 determines that the training has not been ended normally. Then, the processing proceeds to step S305.

In step S305, the CPU 102 determines whether the number of times that the training operation has failed successively reaches P times, which is a preset number of times. If the number of times of failures does not reach P times as a result of the determination (NO in step S305), the CPU 102 increments a count of the number of times of failures by one and the processing returns to step S101 (tb4 in FIG. 10). The CPU 102 repeats the training operation a plurality of times until the training has succeeded in this operation. The number of times that the training operation is repeated in the present exemplary embodiment (the above-described number of times, P times) is predetermined in such a manner that the repetition is completed within the time since the training operation is started for the first time until the readout of the still image is started. It is desirable to set, for example, P=2 or more, but this number of times may be variable according to a predetermined condition.

If the CPU 102 determines that the training operation has failed successively and the count of the number of times of failures reaches P times in step S305 (YES in step S305), the processing proceeds to step S306.

In step S306, the CPU 102 determines whether the number of successive times that the training has failed P times due to the failure to capture the image normally reaches Q times in step S305. If this number of times reaches Q times as a result of the determination (YES in step S306), the processing proceeds to step S307.

Figure 11:
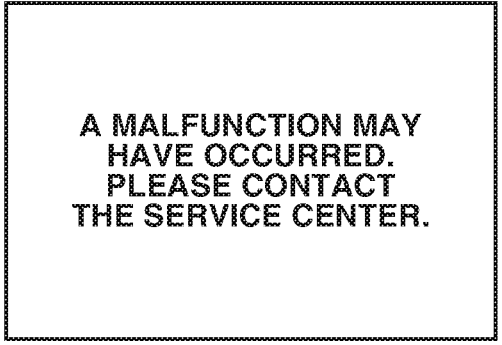
FIG. 11 is a diagram illustrating the operation of the imaging apparatus according to the third exemplary embodiment.

In step S307, the CPU 102 displays a message illustrated in FIG. 11 on the display unit 104. After that, the CPU 102 ends the live view image capturing.

On the other hand, if the number of successive times that the training has failed P times due to the failure to capture the image normally does not reach Q times in step S305 (NO in step S305), the processing proceeds to step S308. In step S308, the CPU 102 performs the processing for restarting the imaging apparatus 1000. After the restart processing, the processing returns to step S101.

The above-described operation allows the imaging apparatus 1000 to conduct the retraining even when the training of the serial data transmission has failed within the image capturing operation, and the moving image can be therefore automatically captured continuously without making the user aware of it.

Further, the imaging apparatus 1000 can conduct the training even in a short time during the readout of the moving image frame by changing whether to conduct the retraining according to the timing of the operation of the imaging apparatus 1000. As a result, the imaging apparatus 1000 can bring the circuits involved in the serial data transmission into the powered-down state even when handling the moving image, and the power consumption can be therefore reduced.

Having described representative exemplary embodiments, the image sensor and the imaging apparatus described in each of the exemplary embodiments can be applied to various applications. For example, the image sensor can also be used to sense light such as infrared light, ultraviolet light, and X rays besides visible light. Further, the imaging apparatus is represented by the digital camera, but, besides it, can also be applied to a mobile phone equipped with a camera such as a smart-phone, a monitoring camera, a game machine, and the like. Further, the imaging apparatus can be applied to an endoscope and a medical appliance that images a blood vessel, a cosmetic appliance for observing skin and a scalp, and a video camera for capturing a sport or action moving image. Then, the imaging apparatus can also be applied to a camera used for traffic purposes such as monitoring of traffic and ships and a dashboard camera, a camera used for academic purposes such as an astronomical observation and an observation of a specimen, a home electric appliance equipped with a camera, a machine vision, and the like. Especially, as the machine vision, the imaging apparatus can also be utilized not only for a robot in a factory or the like but also in agriculture and fishery.

Further, the configuration of the imaging apparatus described in each of the above-described exemplary embodiments indicates merely one example, and the imaging apparatus to which the disclosure can be applied shall not be limited to the configuration illustrated in FIG. 1. Further, the circuit configuration of each of the units of the imaging apparatus shall neither be limited to the configuration illustrated in each of the drawings.

The disclosure can also be embodied by processing that supplies a program capable of realizing one or more functions of the above-described exemplary embodiments to a system or an apparatus via a network or a storage medium, and causes one or more processors in a computer of this system or apparatus to read out and execute the program. Further, the disclosure can also be embodied by a circuit (for example, an application specific integrated circuit (ASIC)) capable of realizing one or more functions.

Any of the above-described exemplary embodiments merely indicates an example of how to embody the disclosure when implementing the embodiments, and the technical scope of the disclosure shall not be construed limitedly by them. In other words, the disclosure can be implemented in various manners without departing from the technical idea thereof or the main features thereof. For example, the disclosure may be used in not only the communication between the image sensor and the signal processing chip but also communication between a signal processing chip and a display unit and communication between signal processing chips.

OTHER EMBODIMENTS

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like. While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-184793, filed Sep. 28, 2018, which is hereby incorporated by reference herein in its entirety.

What is claimed is:

1. An imaging apparatus comprising:
an image sensor configured to acquire image data and to transmit serial data, via a transmission unit, based on a clock embedded procedure, the serial data including the image data; and
a controller having a processor which executes instructions stored in a memory, the controller being configured to function as:
a reception unit configured to receive the serial data and a reference clock, the reception unit including a locking unit and a detection unit,
a generator configured to generate a serial clock, and
a control unit configured to control the reception unit,
wherein the locking unit is configured to perform a locking operation to lock the serial clock to the reference clock and the serial data and the detection unit is configured to detect a lock state of the locking unit,
wherein the control unit controls performing of the locking operation again by the locking unit in a case where locking is not achieved, based on a detection result detected by the detection unit, and
wherein the control unit controls the locking unit to perform the locking operation and to perform the locking operation again within a period from when accumulation of charges in the image sensor corresponding to one frame of image data is started to when reading the one frame of image data is started.

2. The imaging apparatus according to claim 1, wherein the locking operation includes locking the serial clock to the reference clock in a frequency locked loop and the serial data in a phase locked loop.

3. The imaging apparatus according to claim 2, wherein the image sensor includes a plurality of transmission units,
wherein the reception unit includes a plurality of reception units corresponding to the number of the transmission units included in the image sensor, and
wherein the locking operation includes an adjustment of a difference in the data among the plurality of reception units.

4. The imaging apparatus according to claim 1, wherein the detection unit includes a register configured to retain the detection result, and
wherein the control unit controls repeating of the locking operation until the locking is established by the locking unit within a predetermined number of times in a case where the locking is not achieved, based on the detection result retained in the register.

5. The imaging apparatus according to claim 1, wherein the control unit controls executing of first error processing in a case where the locking operation has failed a predetermined number of times.

6. The imaging apparatus according to claim 5, wherein the control unit executes second error processing different from the first error processing in a case where the first error processing is executed a predetermined number of times.

7. The imaging apparatus according to claim 6, further comprising:
a display unit configured to display an image based on the image data,
wherein the first or second error processing includes processing for displaying a message instructing a user to carry out image capturing again on the display unit.

8. The imaging apparatus according to claim 6, further comprising:
a display unit configured to display an image based on the image data,
wherein the first or second error processing includes processing for displaying a message instructing a user to restart the imaging apparatus on the display unit.

9. The imaging apparatus according to claim 6, further comprising:
a display unit configured to display an image based on the image data,
wherein the first or second error processing includes processing for displaying a message indicating a malfunction on the display unit.

10. The imaging apparatus according to claim 6, wherein the first or second error processing includes processing for performing an image capturing operation again.

11. The imaging apparatus according to claim 6, wherein the first or second error processing includes processing for restarting the imaging apparatus.

12. The imaging apparatus according to claim 1,
wherein the locking operation includes a first locking operation and a second locking operation, a locking time period of the second locking operation lasts shorter than the first locking operation, and
wherein the control unit does not perform the locking operation again when controlling the reception unit with use of the second locking operation.

13. The imaging apparatus according to claim 12,
wherein the control unit controls the reception unit into a power saving state during a time period in which the reception unit does not receive the serial data, and
wherein the control unit controls performing of the first locking or second locking operation in correspondence with a timing of ending the power saving state.

14. The imaging apparatus according to claim 12, wherein the control unit controls performing of the first locking operation at the time of a startup.

15. The imaging apparatus according to claim 1 wherein the locking operation is performed such that the serial clock has same frequency and phase as the serial data.

16. The imaging apparatus according to claim 1, wherein image data corresponding to the accumulated charges is image data of a still image.

17. A communication method between an image sensor configured to acquire image data and to transmit serial data, via a transmission unit, based on a clock embedded procedure, the serial data including the image data, and a signal processing unit including a reception unit configured to receive the serial data and a reference clock, the reception unit including a locking unit and a detection unit, the communication method comprising:
performing a locking operation to lock a serial clock to the reference clock and the serial data at the reception unit;
detecting a locking result of the locking operation; and
performing the locking operation again at the reception unit based on a detection result detected by the detecting, and
wherein the locking operation performed and the locking operation is performed again within a period from when accumulation of charges in the image sensor corresponding to one frame of image data is started to when reading the one frame of image data is started.

18. An imaging apparatus comprising:
an image sensor configured to acquire image data and to transmit serial data, via a transmission unit, based on a clock embedded procedure, the serial data including the image data; and
a controller having a processor which executes instructions stored in a memory, the controller being configured to function as:
a reception unit configured to receive the serial data and a reference clock, the reception unit including a locking unit and a detection unit,
a generator configured to generate a serial clock, and
a control unit configured to control the reception unit,
wherein the locking unit is configured to perform a locking operation to lock the serial clock to the reference clock and the serial data and the detection unit is configured to detect a lock state of the locking unit,
wherein the control unit controls performing of the locking operation again by the locking unit in a case where locking is not achieved, based on a detection result detected by the detection unit, and
wherein the control unit controls the locking unit to perform the locking operation within a period from when reading a first frame of a live view image is finished to when reading a second frame next to the first frame of the image is started.

19. An imaging apparatus according to claim 18, wherein the control unit controls the locking unit to perform the locking operation again in a case where locking is not achieved in a locking operation firstly performed after the imaging apparatus is started.

20. An imaging apparatus according to claim 19, wherein the control unit controls the locking unit not to perform the locking operation again in a case where locking is not achieved in a locking operation performed within the period from when reading the first frame of the image is finished to when reading the second frame of the image is started.

21. An imaging apparatus according to claim 20,
wherein the locking operation includes a first locking operation and a second locking operation, a locking time period of the second locking operation lasts shorter than the first locking operation, and
wherein the first locking operation is a locking operation to be firstly performed after the imaging apparatus is started, and the second locking operation is an locking operation to be performed within the period from when reading the first frame of the image is finished to when reading the second frame of the image is started.

22. A communication method between an image sensor configured to acquire image data and to transmit serial data, via a transmission unit, based on a clock embedded procedure, the serial data including the image data, and a signal processing unit including a reception unit configured to receive the serial data and a reference clock, the reception unit including a locking unit and a detection unit, the communication method comprising:
performing a locking operation to lock the serial clock to the reference clock and the serial data at the reception unit;
detecting a locking result of the locking operation; and
performing the locking operation again at the reception unit based on a detection result detected by the detecting,
wherein the locking operation is controlled to be performed within a period from when reading a first frame of a live view image is finished to when reading a second frame next to the first frame of the image is started.

* * * * *